(12) United States Patent
Chow et al.

(10) Patent No.: US 6,828,775 B2
(45) Date of Patent: Dec. 7, 2004

(54) HIGH-IMPEDANCE MODE FOR PRECISION MEASUREMENT UNIT

(75) Inventors: Chung-Kai Chow, Austin, TX (US); Jeffrey Blackburn, Austin, TX (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/371,521

(22) Filed: Feb. 21, 2003

(65) Prior Publication Data

US 2004/0164724 A1 Aug. 26, 2004

(51) Int. Cl.[7] .............................................. G01R 31/26

(52) U.S. Cl. .................................... 324/158.1; 324/765

(58) Field of Search ................................ 324/73.1, 537, 324/763–765, 158.1; 438/14, 17–18; 257/40, 48; 714/724, 733–735

(56) References Cited

U.S. PATENT DOCUMENTS 5,101,153 A * 3/1992 Morong, III ................. 324/537
6,118,293 A * 9/2000 Manhaeve et al. .......... 324/765

* cited by examiner

Primary Examiner—Minh N. Tang
(74) Attorney, Agent, or Firm—O'Melveny & Myers LLP

(57) ABSTRACT

A high-impedance mode is provided for an output of a precision measurement unit (PMU). The PMU includes an output amplifier that provides a forcing voltage or current to a device under test. When the high-impedance mode is activated, the output amplifier is decoupled from an output terminal of the PMU and the output amplifier is disabled. This prevents the voltage on the output terminal from rising in an uncontrolled manner, and prevents current spikes from forming on the output terminal when connected to a device under test. The high-impedance mode is deactivated to permit connection of the PMU to another device under test by re-coupling the output amplifier to the output terminal and enabling operation of the output amplifier.

17 Claims, 3 Drawing Sheets

HIGH-IMPEDANCE MODE FOR PRECISION MEASUREMENT UNIT

BACKGROUND OF THE INVENTION

1. Field of the Invention

The invention relates to the field of semiconductor devices, and more particularly to integrated circuits used for precision measurements in automatic test equipment.

2. Description of Related Art

As part of the manufacturing process, semiconductor devices are subjected to various tests in order to identify faults. This testing can occur at multiple points in the manufacturing process, including testing done before packaging and testing done after packaging. Manufacturer testing of semiconductors is often performed using equipment referred to as automatic test equipment, or ATE. An ATE system can be used in a wide variety of applications, including the identification of defective semiconductors and the sampling of parts for quality control.

Automatic test equipment further includes specialized semiconductor devices known as precision measurement units, or PMUs, that are used to force a signal to a particular current or voltage, and/or to measure the voltage or current on a given signal. An example of a per-pin PMU device is the Edge4707 part manufactured by Semtech Corporation. This part is a four channel device in which each channel can be independently configured to force voltage or current and to sense voltage or current. ATE systems with a large number of individually controllable pins can be constructed using multiple PMUs and the PMUs can have multiple ranges of operation. In the case of the Edge4707, there are four current ranges available in the force current mode, with each being selectable using an input selection control and external resistors. Specifically, a range of ±2 µA, ±20 µA, ±200 µA or ±2 mA can be selected using a two-bit control input, and the range is enabled through the use of four external resistors, nominally 1 M, 100K, 10K and 1K ohms, respectively. In the force voltage mode, an output voltage of –2V through +13V can be selected.

A drawback of conventional PMUs is that when the output pin is disconnected from the device under test, there no longer exists a feedback path from the output amplifier to the pin and back to the input of the amplifier. This causes the output amplifier to drive the output to the maximum value possible, i.e., either maximum positive or maximum negative depending on noise and other circuit conditions. When the output pin is reconnected to a device under test, a momentary voltage or current spike would be present on the output pin that could damage the device under test. One way to avoid the current spike is to power down the entire PMU between each use of the part. But, this adds time to the semiconductor test procedure and additional complexity to the overall design of the ATE.

It would therefore be desirable to provide a high-impedance mode for the output pin of a PMU, so that when a device is not being tested, the output would be in a disconnected state. Such a high-impedance mode would be utilized in ATE between the testing of devices. This would prevent the undesirable current spikes from occurring and avoid the need to power off the entire chip between operations.

SUMMARY OF THE INVENTION

The present invention provides a high-impedance mode for an output of a precision measurement unit (PMU). The PMU includes an output amplifier that provides a forcing voltage or current to a device under test. When the high-impedance mode is activated, the output amplifier is decoupled from an output terminal of the PMU and the output amplifier is disabled. This prevents the voltage on the output terminal from rising in an uncontrolled manner, and prevents current spikes from the output terminal when connected to a device under test. The high-impedance mode is deactivated to permit connection of the PMU to another device under test by re-coupling the output amplifier to the output terminal and enabling operation of the output amplifier.

In one embodiment of the invention, the output of the output amplifier is tied to ground during the time that the output is in the high-impedance mode. When the output is re-connected, the output amplifier is no longer tied to ground.

In another embodiment of the invention, an internal feedback path is established during the time that the output is in the high-impedance mode. When the output is re-connected, the internal feedback path is disconnected.

A more complete understanding of the method and apparatus for providing a high impedance mode for an output of a precision measurement unit will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention is directed to a method and system for providing a high-impedance mode in a precision measurement unit that is free of glitches on the output pin and that does not require powering down the device between applications to a device under test.

Figure 1:
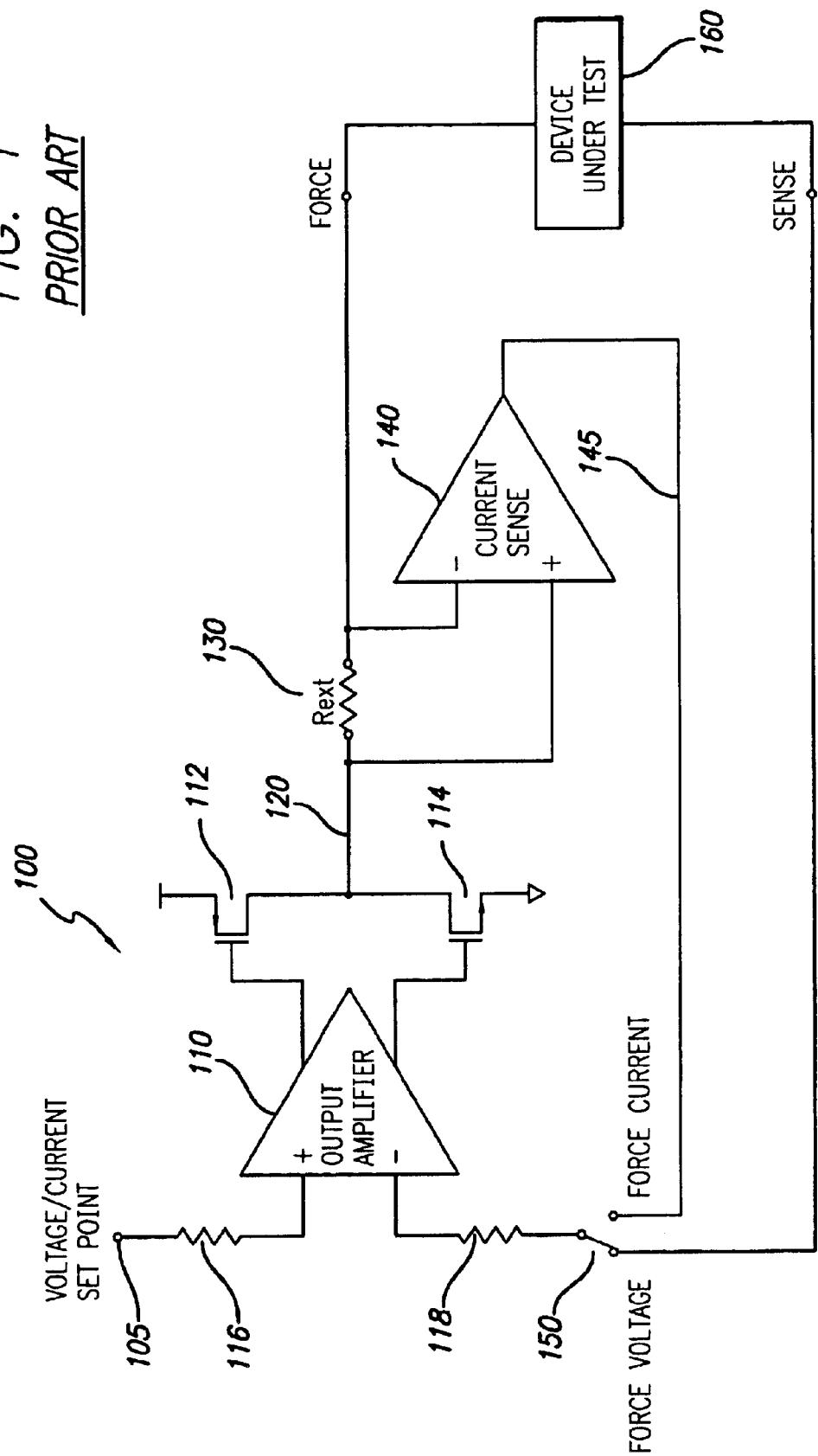
FIG. 1 illustrates a prior art precision measurement unit (PMU).

FIG. 1 illustrates a prior art precision measurement unit (PMU) 100, including an output amplifier 110 having two inputs and a dual-rail output. The positive (+) input of output amplifier 110 is coupled to external pin 105 through series resistor 116, and the negative (–) input is coupled to a pole of a switch 150 through series resistor 118. The two outputs of output amplifier 110 are coupled to the gate of pull-up transistor 112 and to the gate of pull-down transistor 114, respectively. The source of pull-up transistor 112 is coupled to a voltage source, the source of pull-down transistor 114 is coupled to ground, and the drains of transistors 112, 114 are coupled together to define an output 120. An external resistor ($R_{ext}$) 130 is coupled to output 120 and to an output pin labeled "FORCE." The switch 150 includes two contacts labeled "Force Voltage" and "Force Current," respectively. The voltage across external resistor 130 is detected by current sense amplifier 140, which provides an output 145 that is coupled to the Force Current contact of switch 150.

The PMU 100 includes an output pin labeled "FORCE" and an input pin labeled "SENSE". As shown in FIG. 1, the FORCE output pin and the SENSE input pin are coupled together externally. The FORCE output pin is connected to the external resistor 130. The SENSE input pin is connected to the Force Voltage contact of switch 150. It is intended that the FORCE and SENSE pins be connected to corresponding pins of a device under test, and the PMU 100 can be placed in either a "Force Voltage" mode or a "Force Current" mode through the control of switch 150. In the Force Voltage mode, the external signal on the FORCE and SENSE pins is coupled through switch 150 to the negative input of the output amplifier 110. The positive input of output amplifier 110 is connected to external pin 105, which receives an input defining the desired voltage/current of the output. Particularly, the voltage provided on external pin 105 defines the desired voltage set point. In this mode of operation, the feedback path that includes output amplifier 110, pull-up and pull down transistors 112, 114, external resistor 130, the FORCE pin, the SENSE pin, and switch 150 forms a feedback loop that regulates the voltage on the FORCE pin. Output amplifier 110 supplies a variable amount of current, such that the voltage on the FORCE pin matches the voltage on the set point input pin 105.

In the Force Current mode, switch 150 is placed in the "Force Current" position, causing the output of current sensing amplifier 140 to be coupled to the negative input of output amplifier 110. Depending on the value of external resistor Rext 130 and the voltage supplied to external pin 105 connected to the positive input of output amplifier 110, the desired current to be supplied to the device under test is specified. Current sensing amplifier 140 provides a differential output that corresponds to the voltage drop across external resistor Rext 130. For example, if Rext is 1 M ohms and the voltage on pin 105 is 1V, then output amplifier 110 will attempt to supply 1 μA of current to the FORCE pin so that the voltage drop across Rext is 1V, making the output of current sensing amplifier 140 equal to 1V and the voltage applied to the negative input terminal of output amplifier 110 equal to 1V. In the force current mode of operation, the path that includes output amplifier 110, pull-up and pull-down transistors 112, 114, external resistor 130, current sensing amplifier 140, and switch 150 forms a feedback loop in which the desired current applied to the FORCE output pin is maintained.

In each of the Force Voltage and Force Current modes, if the output amplifier 110 is decoupled from the FORCE output pin, the desired voltage or current cannot be maintained. In the Force Voltage mode, the feedback path itself is broken. In the Force Current mode, the current through external resistor 130 drops to zero. In either case, the output amplifier 110 would rapidly force its output to either the maximum positive or maximum negative voltage, depending on the noise and other dynamic circuit conditions. In this case, the voltage at output 120 remains at a high positive or high negative potential until the FORCE output pin is coupled again to the SENSE input pin through an external device under test. When such a re-coupling is made, there would appear a voltage or current spike on the FORCE output pin that would last until the feedback path is re-established and the output amplifier returns to its steady state level. The spike that would occur in this condition could cause damage to the device under test. An alternative would be to power down the entire PMU 100 in between applications to a device under test. In that case, no voltage or current spike would occur, but powering down the PMU 100 involves additional time and complexity. In typical ATE environments, the time to test a device is a critical parameter and thus decreasing the time necessary for testing is important.

Figure 2:
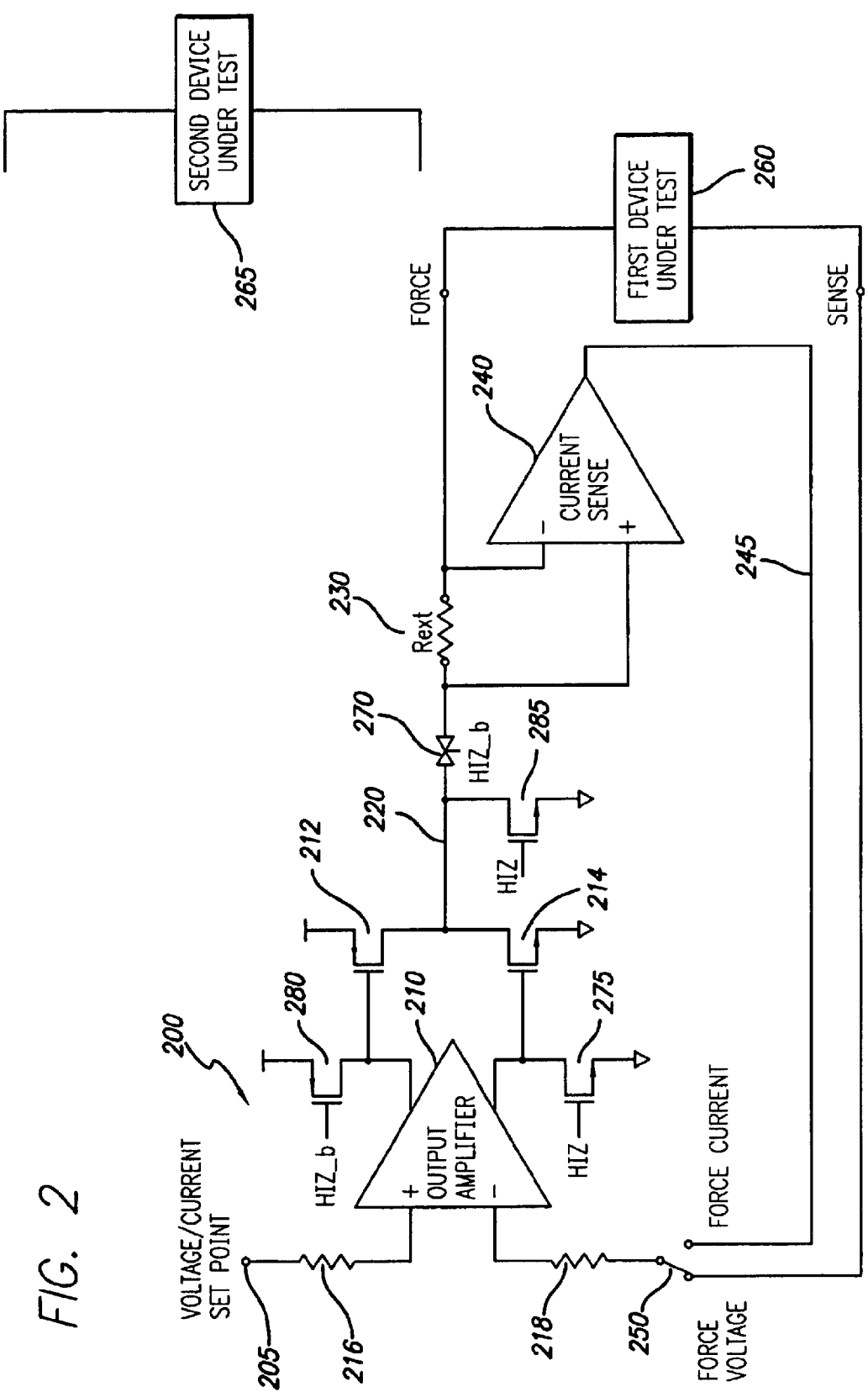
FIG. 2 illustrates a PMU in accordance with an embodiment of the invention.

FIG. 2 illustrates a PMU 200 in accordance with an embodiment of the invention, which solves the problem of having a voltage or current spike on the FORCE output pin without requiring powering down of the entire device. The PMU 200 includes an output amplifier 210 that has two inputs and a dual-rail output. The positive (+) input of output amplifier 210 is coupled to external pin 205 through series resistor 216, and the negative (−) input is coupled to a pole of a switch 250 through a series resistor 218. The two outputs of output amplifier 210 are coupled to the gate of a pull-up transistor 212 and to the gate of a pull-down transistor 214, respectively, as in the prior art construction of FIG. 1. The drains of pull-up transistor 212 and pull-down transistor 214 are commonly coupled to output 220. The operation of output amplifier 210, external resistor Rext 230, current sensing amplifier 240 and switch 250 is substantially similar to the analogous devices 110, 130, 140 and 150 discussed above.

PMU unit 200 additionally includes switch 270 and transistors 275, 280 and 285. The negative output of output amplifier 210 is also coupled to the drain of a second pull-up transistor 280 and the positive output of amplifier 210 is also coupled to the drain of a second pull-down transistor 275. The output 220 is also coupled to the source of a third pull-down transistor 285 and to a first side of the switch 270. The second side of switch 270 is coupled to an external resistor 230, which is also coupled to an output pin labeled "FORCE." The two ends of external resistor 230 are also coupled individually to two inputs of a current sense amplifier 240, the output 245 of which is coupled to a contact of switch 250 labeled "Force Current". An input pin labeled "SENSE" is coupled to a contact of switch 250 labeled "Force Voltage". The control of switch 270 is coupled to a logic signal labeled "Hiz_b", such that the switch 270 is conducting when Hiz_b is high. Hiz_b is also provided to the gate of pull-up transistor 280. A logic signal labeled "Hiz" is provided to the gates of pull-down transistors 275, 285.

Switch 270 is used to decouple output amplifier 210 from the FORCE output pin during the high-impedance mode. When the signal Hiz is low and Hiz_b is high, the output amplifier 210 is enabled and the PMU 200 operates as discussed above for PMU 100. Conversely, when the signal Hiz is high and Hiz_b is low, the high-impedance mode is active in which transistors 275, 280 and 285 disable the output amplifier 210 and force its output to ground.

PMU 200 enters the high impedance mode by first decoupling output amplifier 210 from the FORCE output pin. This is accomplished by forcing s which opens switch 270. Next, activating transistors 275, 280 and 285 disables output amplifier 210. When transistor 275 turns on, the gate of transistor 214 will pull to ground to shut off transistor 214. Likewise, when transistor 280 turns on, the gate of transistor 212 will pull to the voltage source to shut off transistor 212. This effectively disables operation of the output amplifier 210. When transistor 285 turns on, the output 220 is pulled to ground. In this condition, the FORCE output pin is in a high impedance state and the PMU will not source any current to that pin. Pull-down transistor 285 is optional and may be excluded in an alternative embodiment. When the high impedance mode is deactivated, output amplifier 210 is first coupled to the output pin by closing switch 270. Output amplifier 210 is then enabled by turning off transistors 275, 280 and 285. This allows the feedback path to be reestablished and the specified voltage or current to be provided. Since the output 220 is grounded when switch 270 is turned on, there will be no voltage or current spike on the FORCE output pin.

Figure 3:
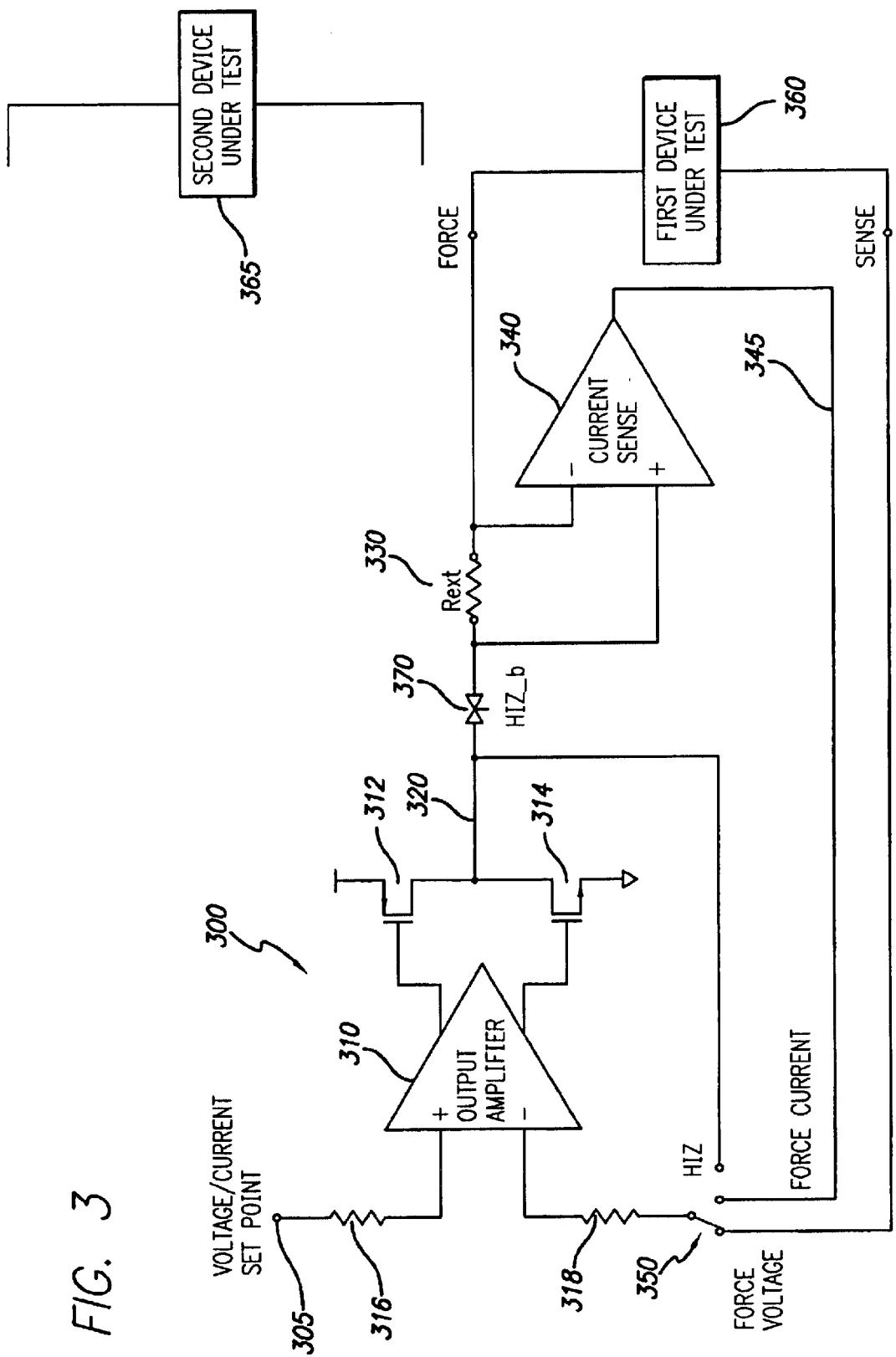
FIG. 3 illustrates a PMU in accordance with a second embodiment of the invention.

FIG. 3 illustrates a PMU 300 in accordance with another embodiment of the invention. PMU 300 includes an output amplifier 310 having two inputs and a dual-rail output. The positive (+) input of output amplifier 310 is coupled to external pin 305 through series resistor 316, and the negative (−) input is coupled to a pole of switch 350 through series resistor 318. The two outputs of output amplifier 310 are coupled to the gate of a pull-up transistor 312 and to the gate of a pull-down transistor 314, respectively. The drains of pull-up transistor 312 and pull-down transistor 314 are commonly coupled to output 320. Also coupled to output 320 is a first side of a switch 370. The second side of switch 370 is coupled to an external resistor 330, which is also coupled to an output pin labeled "FORCE." The two ends of external resistor 330 are also coupled individually to two inputs of a current sense amplifier 340, the output of which is coupled to a contact of switch 350 labeled "FORCE CURRENT". An input pin labeled "SENSE" is coupled to a contact of switch 350 labeled "FORCE VOLTAGE". The control of switch 370 is coupled to a logic signal labeled "Hiz_b" that is low when high-impedance mode is active. The control of switch 380 coupled to a logic signal labeled "Hiz" that is high when high-impedance mode is active. Switch 350 further includes a third contact labeled "Hiz" that is connected to the output 320.

The operation of PMU 300 with respect to output amplifier 310, high impedance switch 370, external resistor Rext 330, current sense amplifier 340 and switch 350 is substantially the same as the analogous devices 210, 270, 230, 240 and 250 discussed above. The switch 350 connects the output of output amplifier 310 back to the negative input (−) of the output amplifier. PMU 300 enters the high impedance mode by first decoupling output amplifier 310 from the FORCE output pin. This is accomplished by forcing signal Hiz_b low which opens switch 370. Activating an internal feedback path by connecting switch 350 to the Hiz contact limits the gain of the output amplifier 310 and results in the formation of a voltage follower circuit that prevents output amplifier 310 from reaching high positive or negative voltages. In fact, the voltage at output 320 will be driven to the same potential as the voltage at input pin 305. When the high impedance mode is deactivated, the output amplifier is first coupled to the FORCE output pin by forcing signal Hiz_b high, closing switch 370. When switch 350 is reconfigured, the voltage follower mode is discontinued, the feedback path is reestablished and output amplifier 310 will again be driven to its appropriate steady state condition.

Having thus described a preferred embodiment of method and system for providing a high-impedance mode in a precision measurement unit, it should be apparent to those skilled in the art that certain advantages of the described invention have been achieved. It should also be appreciated that various modifications, adaptations, and alternative embodiments thereof may be made within the scope and spirit of the present invention. The invention is further defined by the following claims.

What is claimed is:

1. A method of operating a precision measurement unit (PMU) having an output amplifier that provides a forcing voltage or current to a device under test, comprising the steps of:
    activating a high-impedance mode of said PMU to safely permit disconnection of said PMU from a first device under test by decoupling the output amplifier from an output terminal of the PMU and disabling operation of said output amplifier; and
    deactivating said high-impedance mode to safely permit connection of said PMU to a second device under test by coupling said output amplifier to said output terminal and enabling operation of said output amplifier.

2. The method of claim 1, wherein the activating step further comprises forcing an output of the output amplifier to ground.

3. The method of claim 2, wherein the deactivating step further comprises enabling said output of said output amplifier to return to an operational level.

4. The method of claim 1, wherein the activating step further comprises connecting an internal feedback path between an output and an input of said output amplifier to thereby limit gain of said output amplifier.

5. The method of claim 4, wherein the deactivating step further comprises disconnecting said internal feedback path.

6. The method of claim 1, wherein said activating step further comprises decoupling the output amplifier from the output terminal prior to disabling operation of said output amplifier.

7. The method of claim 1, where said deactivating step further comprises coupling said output amplifier to said output terminal prior to enabling said output amplifier.

8. A precision measurement unit (PMU), comprising:
    an output amplifier operatively connected to an output terminal of said PMU to selectively provide either a forcing voltage or a forcing current therefrom
    a high impedance mode circuit operatively connected to said output amplifier to decouple said output amplifier from said output terminal and disable operation of said output amplifier;
    wherein, said high impedance mode circuit is enabled to safely permit disconnection of said output terminal from a first device under test and disabled to safely permit connection of said output terminal to a second device under test.

9. The precision measurement unit of claim 8, wherein said high impedance mode circuit further comprises a switch connected between said output amplifier and said output terminal, said switch being in an open condition when said high impedance mode circuit is enabled.

10. The precision measurement unit of claim 8, wherein said high impedance mode circuit further comprising a first transistor coupled to a positive output of said output amplifier, said first transistor coupling said positive output to a positive voltage reference when said high impedance mode circuit is enabled.

11. The precision measurement unit of claim 10, wherein said high impedance mode circuit further comprising a second transistor coupled to a negative output of said output amplifier, said second transistor coupling said negative output to a negative voltage reference when said high impedance mode circuit is enabled.

12. The precision measurement unit of claim 8, wherein said high impedance mode circuit further comprises a feedback path coupled between an output of said output amplifier and an input of said output amplifier, said feedback path including a switch, said switch being in a closed condition when said high impedance mode circuit is enabled.

13. A precision measurement unit (PMU), comprising:
    an output amplifier operatively connected to an output terminal of said PMU to selectively provide either a forcing voltage or a forcing current therefrom;
    means operatively connected to said output amplifier for decoupling said output amplifier from said output terminal and disabling operation of said output amplifier to safely permit disconnection of said output terminal from a device under test.

14. The precision measurement unit of claim 13, wherein said means further comprises a switch connected between said output amplifier and said output terminal, said switch being in an open condition when said means is enabled.

15. The precision measurement unit of claim 13, wherein said means further comprising a first transistor coupled to a positive output of said output amplifier, said first transistor coupling said positive output to a positive voltage reference when said means is enabled.

16. The precision measurement unit of claim 15, wherein said means further comprising a second transistor coupled to a negative output of said output amplifier, said second transistor coupling said negative output to a negative voltage reference when said means is enabled.

17. The precision measurement unit of claim 13, wherein said means further comprises a feedback path coupled between an output of said output amplifier and an input of said output amplifier, said feedback path including a switch, said switch being in a closed condition when said means is enabled.

* * * * *